United States Patent
Hsiang et al.

(10) Patent No.: US 10,903,681 B2
(45) Date of Patent: Jan. 26, 2021

(54) SOLAR DISPLAY DEVICE AND POWER SWITCHING METHOD

(71) Applicant: Acer Incorporated, New Taipei (TW)

(72) Inventors: Jui-Chieh Hsiang, New Taipei (TW); Chih-Chiang Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 16/667,912

(22) Filed: Oct. 30, 2019

(65) Prior Publication Data
US 2020/0343760 A1    Oct. 29, 2020

(30) Foreign Application Priority Data
Apr. 24, 2019    (TW) .............................. 108114326 A

(51) Int. Cl.
*H02J 7/35*    (2006.01)
*H02J 3/38*    (2006.01)
*H02S 20/32*    (2014.01)

(52) U.S. Cl.
CPC ................ *H02J 7/35* (2013.01); *H02J 3/385* (2013.01); *H02S 20/32* (2014.12)

(58) Field of Classification Search
CPC ....................................................... H02J 7/35
USPC ............................................................ 307/46
See application file for complete search history.

(56) References Cited

U.S. PATENT DOCUMENTS

| 9,484,332 | B2 | 11/2016 | Natarajan et al. | |
|---|---|---|---|---|
| 2012/0291835 | A1 | 11/2012 | Lu et al. | |
| 2013/0050599 | A1* | 2/2013 | Yoshida ................ | H01L 31/075 349/33 |
| 2014/0355168 | A1 | 12/2014 | Bibl et al. | |
| 2015/0244315 | A1 | 8/2015 | McNamara et al. | |
| 2017/0316750 | A1* | 11/2017 | Yamazaki ......... | G02F 1/133553 |

FOREIGN PATENT DOCUMENTS

CN        205092020        3/2016

* cited by examiner

*Primary Examiner* — Joseph Chang
(74) *Attorney, Agent, or Firm* — JCIPRNET

(57) ABSTRACT

A solar display device and a power switching method are disclosed. The solar display device includes a plurality of solar pixel components, a plurality of micro display components and a power control circuit. The solar pixel components are configured to generate a first solar power and a second solar power. The power control circuit is configured to compare the first solar power and a reference signal. The power control circuit is further configured to drive the micro display components by using one of a system power and the second solar power according to a comparison result.

17 Claims, 9 Drawing Sheets

SOLAR DISPLAY DEVICE AND POWER SWITCHING METHOD

CROSS-REFERENCE TO RELATED APPLICATION

This application claims the priority benefit of Taiwan patent application serial no. 108114326, filed on Apr. 24, 2019. The entirety of the above-mentioned patent application is hereby incorporated by reference herein and made a part of this specification.

BACKGROUND

Technical Field

The invention relates to a power switching technique, and particularly relates to a solar display device and a power switching method.

Description of Related Art

Since micro Light-emitting diode (LED) displays have advantages of high brightness, high contrast, wide viewing angle, long service life and low power consumption, etc., they are widely applied to various display devices. Moreover, solar energy is an emerging renewable energy source that relies on sunlight to generate electricity. However, under different sunlight intensities, the generated solar power may be sometimes strong and sometimes weak. Therefore, if the micro LED display is simply combined with the solar power generation technology, a problem of insufficient driving ability of the micro LED may occur under certain sunlight conditions.

SUMMARY

The invention is directed to a solar display device and a power switching method, which are adapted to mitigate the aforementioned problem.

An embodiment of the invention provides a solar display device including a plurality of solar pixel components, a plurality of micro display components and a power control circuit. The solar pixel components are configured to generate a first solar power and a second solar power. The micro display components are coupled to the solar pixel components. The power control circuit is coupled to the solar pixel components and the micro display components. The power control circuit is configured to compare the first solar power and a reference signal. The power control circuit is further configured to use one of a system power and the second solar power to drive the micro display components according to a comparison result.

An embodiment of the invention provides a power switching method, which is adapted to a solar display device. The solar display device includes a plurality of solar pixel components and a plurality of micro display components. The power switching method includes: generating a first solar power and a second solar power by the solar pixel components; comparing the first solar power and a reference signal; and using one of a system power and the second solar power to drive the micro display components according to a comparison result.

Based on the above description, the solar pixel components in the solar display device are capable of generating the first solar power and the second solar power. After comparing the first solar power with the reference signal, the system power of the solar display device or the second solar power may be used for driving the micro display components in the solar display device according to the comparison result. In this way, under any sunlight condition, the display and driving capability of the solar display device may be maintained stable, thus achieving a balance between power saving and system efficiency.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
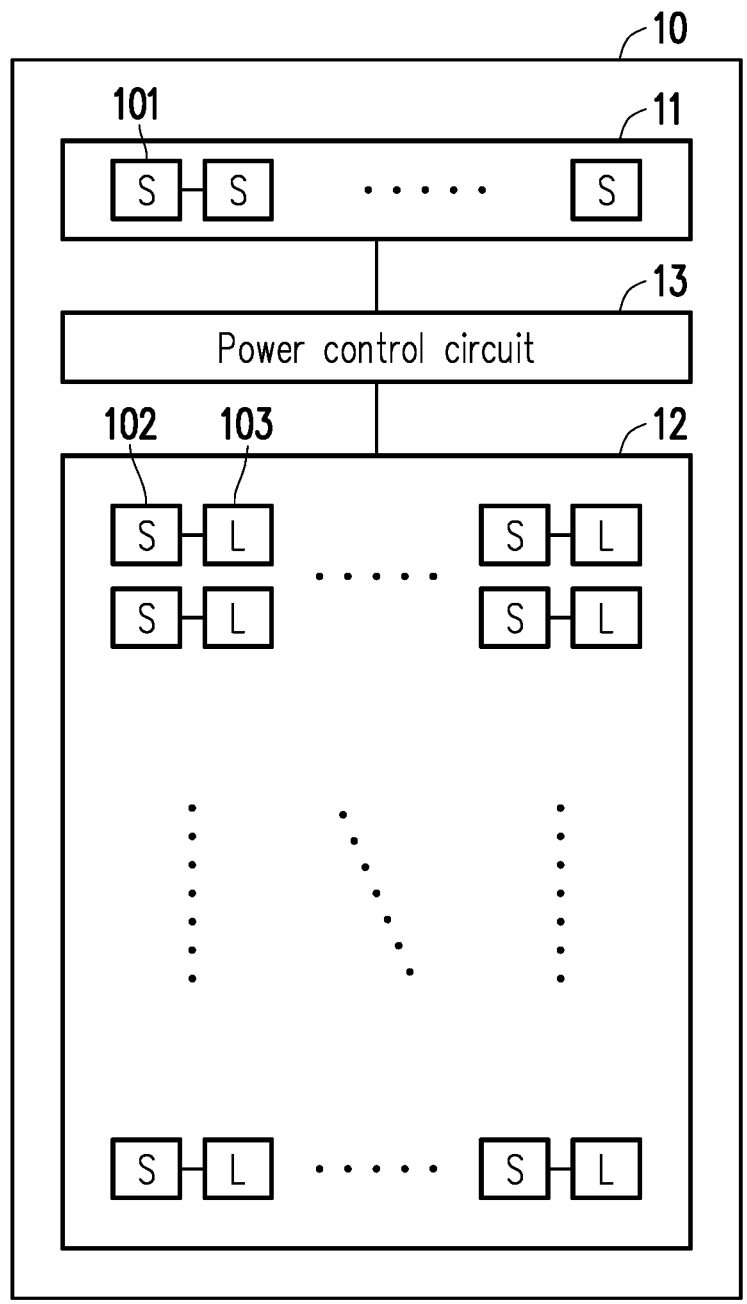
FIG. 1 is a schematic diagram of a solar display device according to an embodiment of the invention.

FIG. 1 is a schematic diagram of a solar display device according to an embodiment of the invention. Referring to FIG. 1, in an embodiment, the solar display device 10 may be a wearable device supporting solar power supply and having a display function such as a smart watch or a smart bracelet, etc. Alternatively, in an embodiment, the solar display device 10 may also be an electronic device supporting solar power supply and having a display function such as a smart phone, a tablet computer or a kiosk, etc. The device type of the solar display device 10 is not limited by the invention.

The solar display device 10 includes a solar pixel array 11, a mixed pixel array 12 and a power control circuit 13. The solar pixel array 11 includes a plurality of solar pixel components 101. Each of the solar pixel components 101 includes one or a plurality of grains and is used for sensing sunlight to produce a solar power (which is also referred to as a first solar power).

The mixed pixel array 12 includes a plurality of solar pixel components 102 and a plurality of micro display components 103. The solar pixel components 102 are coupled to (for example, electrically connected to) the micro display components 103. The solar pixel components 101 may be the same or similar to the solar pixel components 102. For example, each of the solar pixel components 102 includes one or a plurality of grains and is used for sensing sunlight to produce a solar power (which is also referred to as a second solar power). Moreover, each of the micro display components 103 is a micro LED and is driven by current to emit light.

In the embodiment, the solar pixel array 11 is disposed in a non-active display region of the solar display device 10, and the mixed pixel array 12 is disposed in an active display region of the solar display device 10. The non-active display region does not have an image display function, and the active display region has the image display function (provided by the micro display components 103). Taking a smart watch as an example, the solar pixel array 11 may be located in a non-active display region of a watch surface, and the mixed pixel array 12 may be located in an active display region of the watch surface. In the active display region, the micro display components 103 arranged in an array may be used for displaying information such as a system time, weather, an instant message and/or a call, etc.

It should be noted that in an embodiment, the solar pixel array 11 may also be not configured. In an embodiment, if the solar pixel array 11 is not configured, the first solar power and the second solar power may all be produced by the solar pixel components 102 in the mixed pixel array 12. Moreover, in an embodiment, one solar pixel component 102 may be configured to supply power to one or a plurality of connected micro display components 103.

The power control circuit 13 is coupled to the solar pixel components 101, the solar pixel components 102 and the micro display components 103. The power control circuit 13 is configured to compare the first solar power and a reference signal. According to a comparison result, the power control circuit 13 may use one of a system power of the solar display device 10 and the second solar power to drive the micro display components 103. For example, if a current value of the first solar power is higher than a current value of the reference signal (which is also referred to as a first comparison result), the power control circuit 13 may use the second solar power to drive the micro display components 103. Alternatively, if the current value of the first solar power is not higher than the current value of the reference signal (which is also referred to as a second comparison result), the power control circuit 13 may use the system power to drive the micro display components 103.

In an embodiment, the system power is data power (which is also referred to as a data signal) provided through a data line in the mixed pixel array 12. The data power may be used for driving the micro display components 103. Alternatively, in an embodiment, the system power is an external power provided by an external power supplier of the solar display device 10. The external power may also be used for driving the micro display components 103.

Figure 2:
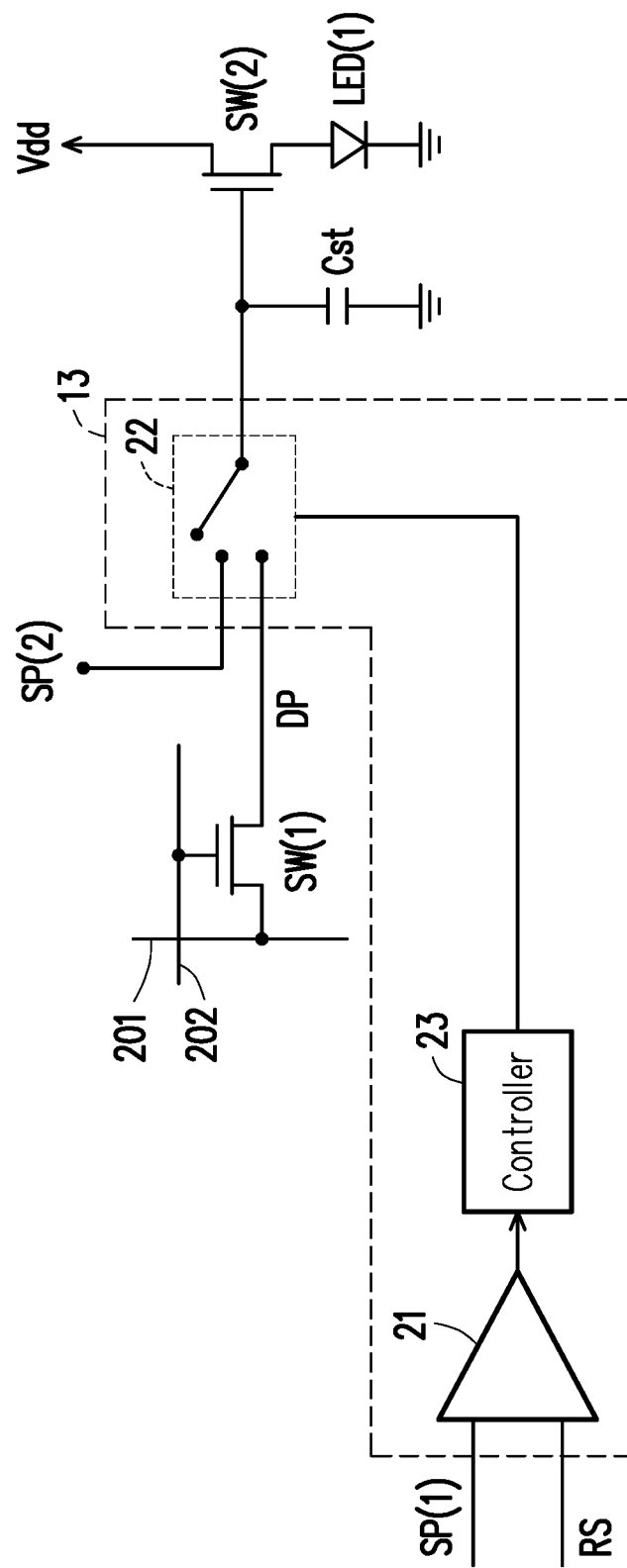
FIG. 2 is a schematic diagram of a power control circuit according to an embodiment of the invention.

FIG. 2 is a schematic diagram of a power control circuit according to an embodiment of the invention. Referring to FIG. 2, in the embodiment, the power control circuit 13 includes a comparator 21, a switch circuit 22 and a controller 23. The controller 23 is coupled to the comparator 21 and the switch circuit 22. The comparator 21 may receive a solar power SP(1) (i.e., the first solar power) and a reference signal RS. In an embodiment, the reference signal RS may be provided by an internal circuit (not shown). Alternatively, in an embodiment, the controller 23 may generate the reference signal RS by looking up a table and provide the reference signal RS to the comparator 21.

The comparator 21 may compare the solar power SP(1) with the reference signal RS and generates a comparison signal according to a comparison result. The controller 23 may control the switch circuit 22 to use a system power (for example, the data power DP) or a solar power SP(2) (i.e., the second solar power) to drive the micro display component LED(1) according to the comparison signal. For example, the micro display component LED(1) may be any micro display component 103 in FIG. 1.

To be specific, in the embodiment, the mixed pixel array 12 of FIG. 1 includes a data line 201, a scan line 202, a transistor SW(1), a transistor SW(2), a capacitor Cst and a micro display component LED(1). A first terminal (for example, a gate) of the transistor SW(1) is coupled to the scan line 202. A second terminal (for example, a source) of the transistor SW(1) is coupled to the data line 201. A third terminal (for example, a drain) of the transistor SW(1) is coupled to a first input terminal of the switch circuit 22. A second input terminal of the switch circuit 22 is coupled to the solar pixel component 102 to receive the solar power SP(2).

A first terminal (for example, a gate) of the transistor SW(2) is coupled to an output terminal of the switch circuit 22. A second terminal (for example, a source) of the transistor SW(2) is coupled to a working power Vdd. A third terminal (for example, a drain) of the transistor SW(2) is coupled to the micro display component LED(1). The capacitor Cst may be coupled to the first terminal of the transistor SW(2). Moreover, the transistors SW(1) and SW(2) may both be thin-film transistors (TFT).

According to the comparison result of the comparator 21, the controller 23 may control the switch circuit 22 to provide the data power DP (i.e. the system power) coming from the data line 201 or the solar power SP(2) to the first terminal of the switch SW(2), so as to drive the micro display component LED(1) through the third terminal of the transistor SW(2). For example, in response to a first comparison result (for example, a current value of the solar power SP(1) is higher than a current value of the reference signal RS), the controller 23 may control the switch circuit 22 to provide the solar power SP(2) to the transistor SW(2), so as to drive the micro display component LED(1). Alternatively, in response to a second comparison result (for example, the current value of the solar power SP(1) is not higher than the current value of the reference signal RS), the controller 23 may control the switch circuit 22 to provide the data power DP to the transistor SW(2), so as to drive the micro display component LED(1).

Figure 3:
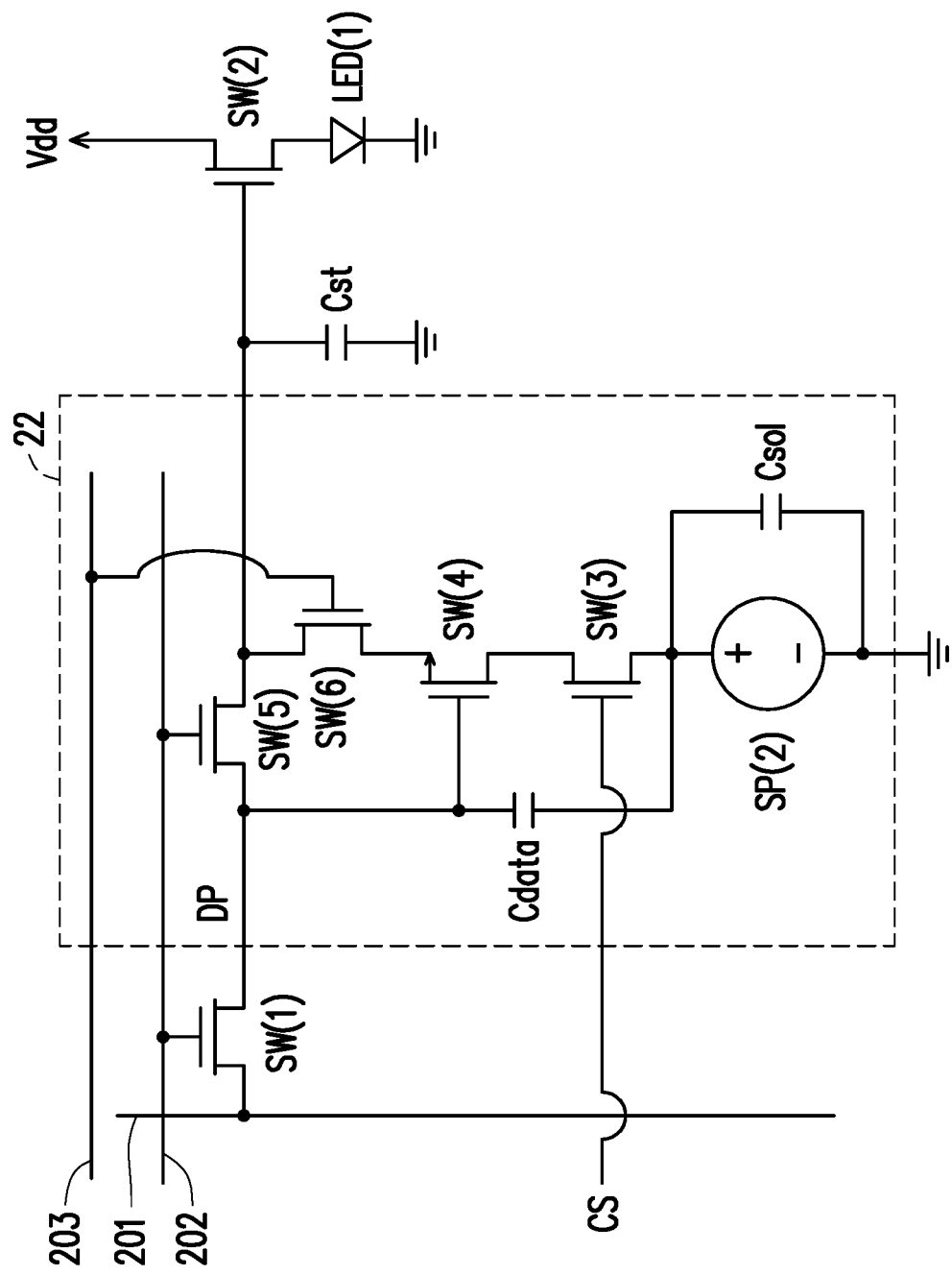
FIG. 3 is a schematic diagram of a switch circuit according to an embodiment of the invention.

FIG. 3 is a schematic diagram of a switch circuit according to an embodiment of the invention. Referring to FIG. 3, in the embodiment, the switch circuit 22 includes an update line 203, transistors SW(3)-SW(6), a capacitor Cdata and a capacitor Csol. A first terminal (for example, a gate) of the transistor SW(3) is used for receiving a control signal CS coming from the controller 23 of FIG. 2. A second terminal (for example, a source) of the transistor SW(3) is used for receiving the solar power SP(2). A first terminal (for example, a gate) of the transistor SW(4) is coupled to the third terminal of the transistor SW(1). A second terminal (for example, a source) of the transistor SW(4) is coupled to a third terminal (for example, a drain) of the transistor SW(3). A first terminal (for example, a gate) of the transistor SW(5) is coupled to the scan line 202. A second terminal (for example, a source) of the transistor SW(5) is coupled to the third terminal of the transistor SW(1). A first terminal (for example, a gate) of the transistor SW(6) is coupled to the update line 203. A second terminal (for example, a source) of the transistor SW(6) is coupled to a third terminal (for example, a drain) of the transistor SW(4). A third terminal (for example, a drain) of the transistor SW(5) is coupled to a third terminal (for example, a drain) of the transistor SW(6) and the first terminal of the transistor SW(2).

When images are displayed, corresponding to a certain frame, the update line 203 may provide an update signal to turn on the transistor SW(6). In response to the control signal CS turning on the transistor SW(3), the solar power SP(2) may be provided to the first terminal of the transistor SW(2) through the transistors SW(3), SW(4) and SW(6), so as to drive the micro display component LED(1). Alternatively, in response to the control signal CS not turning on the transistor SW(3), a scan signal on the scan line 202 may turn on the transistors SW(1) and SW(5), and the data power DP may be provided to the first terminal of the transistor SW(2) through the transistor SW(5), so as to drive the micro display component LED(1).

Figure 4:
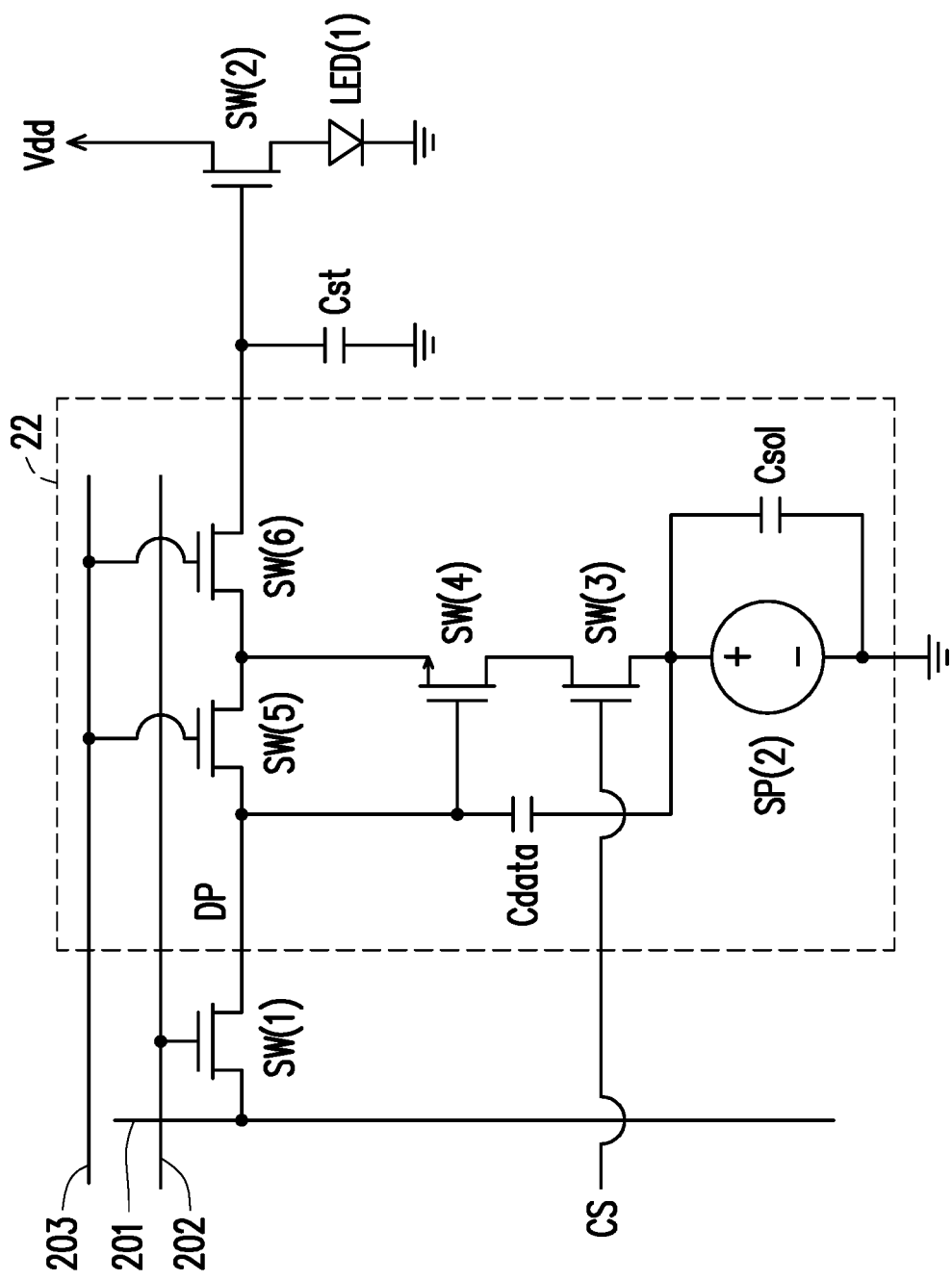
FIG. 4 is a schematic diagram of a switch circuit according to an embodiment of the invention.

FIG. 4 is a schematic diagram of a switch circuit according to an embodiment of the invention. Referring to FIG. 4, in the embodiment, the first terminal of the transistor SW(5) and a first terminal (for example, a gate) of the transistor SW(6) are both coupled to the update line 203. A second terminal (for example, a source) of the transistor SW(6) is coupled to the third terminal of the transistor SW(5) and the third terminal of the transistor SW(4). A third terminal (for example, a drain) of the transistor SW(6) is coupled to the first terminal of the transistor SW(2).

The update line 203 may provide an update signal to turn on the transistors SW(5) and SW(6). In response to the control signal CS turning on the transistor SW(3), the solar power SP(2) may be provided to the transistor SW(2) through the transistors SW(3), SW(4) and SW(6). Alternatively, in response to the control signal CS not turning on the transistor SW(3), the scan signal on the scan line 202 may turn on the transistors SW(1) and SW(5), and the data power DP may be provided to the transistor SW(2) through the transistors SW(5) and SW(6).

Figure 5:
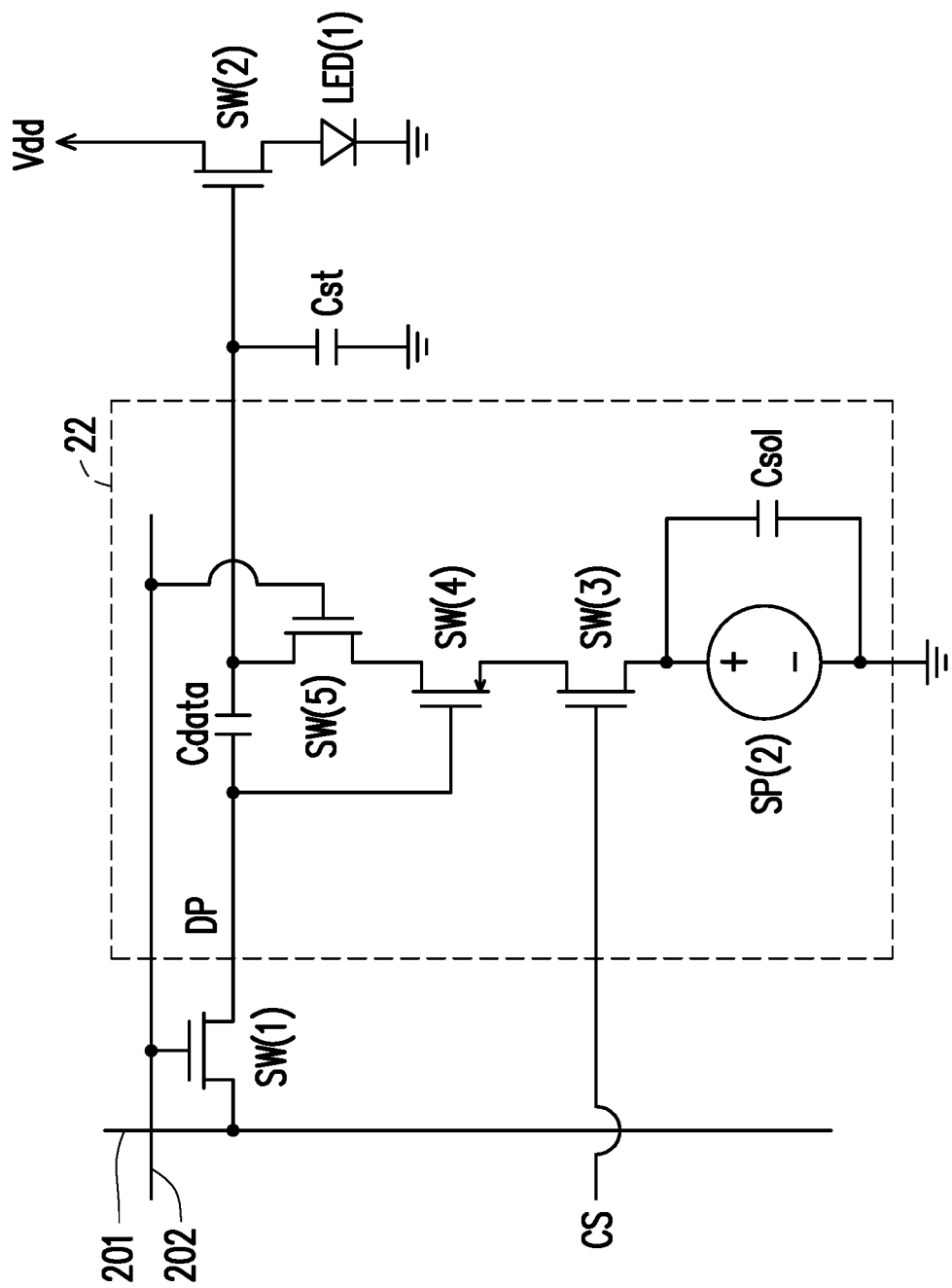
FIG. 5 is a schematic diagram of a switch circuit according to an embodiment of the invention.

FIG. 5 is a schematic diagram of a switch circuit according to an embodiment of the invention. Referring to FIG. 5, in the embodiment, a first terminal (for example, a gate) of the transistor SW(5) is coupled to the scan line 202. A second terminal (for example, a source) of the transistor SW(5) is coupled to the third terminal of the transistor SW(4). A third terminal (for example, a drain) of the transistor SW(5) is coupled to the first terminal of the transistor SW(2) and is coupled to the third terminal of the transistor SW(1) through the capacitor Cdata.

The scan line 202 may provide the scan signal to the first terminal of the transistor SW(5) to turn on the transistor SW(5). In response to the control signal CS turning on the transistor SW(3), the solar power SP(2) may be provided to the transistor SW(2) through the transistors SW(3), SW(4) and SW(5). Alternatively, in response to the control signal CS not turning on the transistor SW(3), the data power DP may be provided to the transistor SW(2) through the capacitor Cdata.

It should be noted that in the embodiments of FIG. 3 and FIG. 4, the transistors SW(3), SW(5) and SW(6) are thin-film transistors, and the transistor SW(4) is an N-type Metal Oxide Semiconductor (NMOS) field effective transistor (FET). However, in the embodiment of FIG. 5, the transistors SW(3) and SW(5) are thin-film transistors, and the transistor SW(4) is a P-type Metal Oxide Semiconductor (PMOS) FET.

Figure 6:
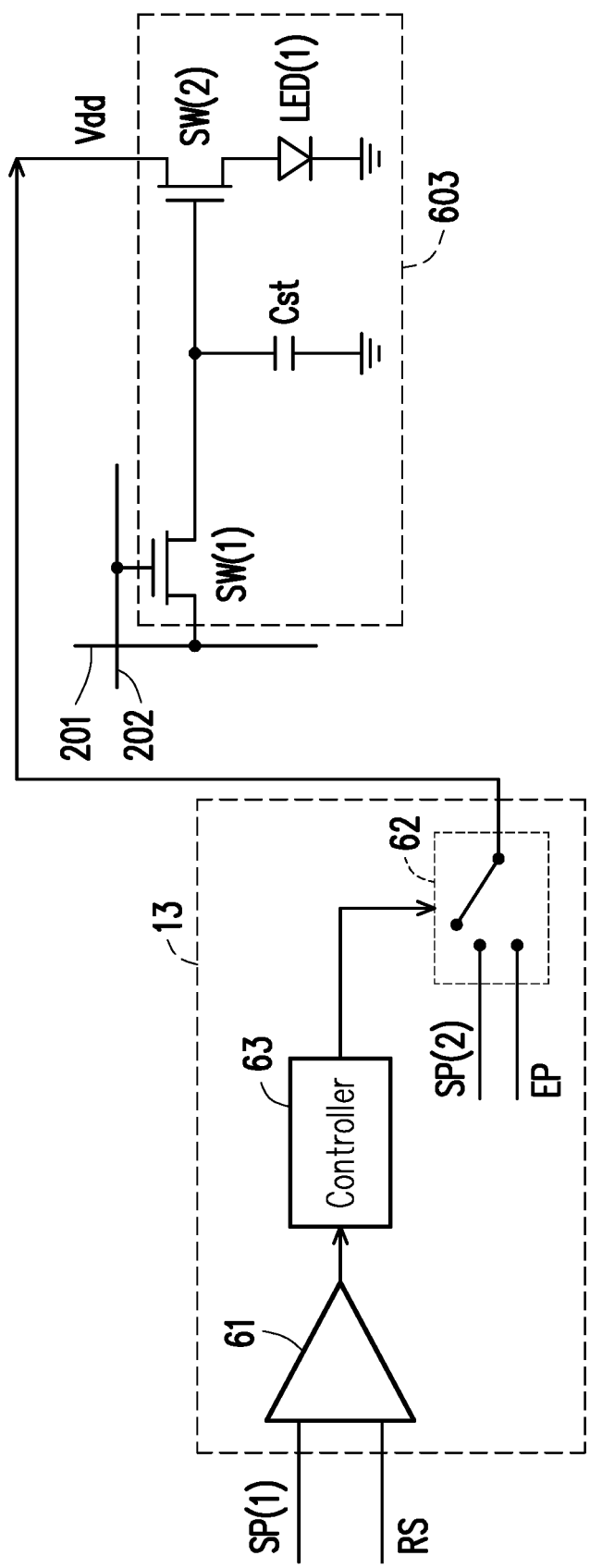
FIG. 6 is a schematic diagram of a power control circuit according to an embodiment of the invention.

FIG. 6 is a schematic diagram of a power control circuit according to an embodiment of the invention. Referring to FIG. 6, in the embodiment, the power control circuit 13 includes a comparator 61, a switch circuit 62 and a controller 63. The controller 63 is coupled to the comparator 61 and the switch circuit 62. The comparator 61 may compare the solar power SP(1) and the reference signal RS and generate a comparison signal according to a comparison result. The controller 63 may control the switch circuit 62 to use a system power (for example, an external power) or the solar power SP(2) (i.e., the second solar power) to drive the micro display component LED(1) according to the comparison signal.

According to the comparison result of the comparator 61, the controller 63 may control the switch circuit 62 to provide the external power EP (i.e., the system power) provided by an external power supplier or the solar power SP(2) as the working power Vdd to the second terminal of the transistor SW(2), so as to drive the micro display component LED(1) through the third terminal of the transistor SW(2). For example, in response to a first comparison result (for example, a current value of the solar power SP(1) is higher than a current value of the reference signal RS), the controller 63 may control the switch circuit 62 to provide the solar power SP(2) as the working power Vdd to the transistor SW(2), so as to drive the micro display component LED(1). Alternatively, in response to a second comparison result (for example, the current value of the solar power SP(1) is not higher than the current value of the reference signal RS), the controller 63 may control the switch circuit 62 to provide the external power EP as the working power Vdd to the transistor SW(2), so as to drive the micro display component LED(1).

In the embodiment of FIG. 6, a light-emitting module 603 may include the transistor SW(1), the transistor SW(2), the capacitor Cst and the micro display component LED(1). The working power Vdd may be provided to the light-emitting module 603 for electronic components therein (for example, the transistor SW(2)) to use.

Figure 7:
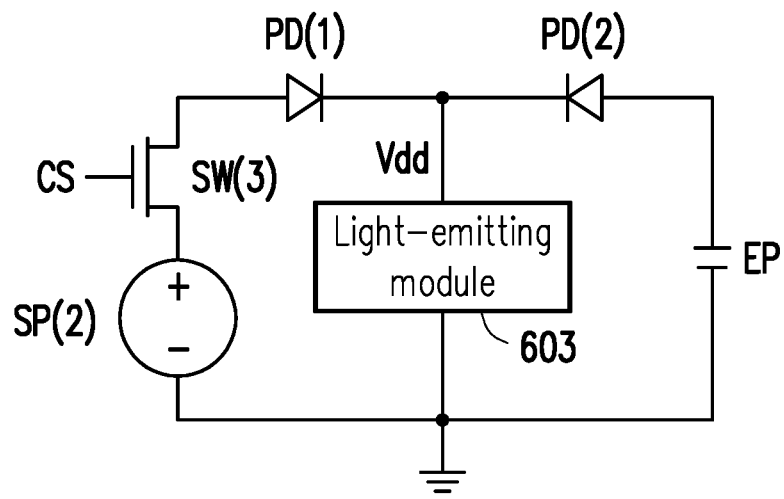
FIG. 7 is a schematic diagram of a switch circuit according to an embodiment of the invention.

FIG. 7 is a schematic diagram of a switch circuit according to an embodiment of the invention. Referring to FIG. 7, in the embodiment, the switch circuit 62 includes a transistor SW(3), a unidirectional diode PD(1) and a unidirectional diode PD(2). A first terminal (for example, a gate) of the transistor SW(3) is configured to receive the control signal CS coming from the controller 63 of FIG. 6. A second terminal (for example, a source) of the transistor SW(3) is configured to receive the solar power SP(2). A third terminal (for example, a drain) of the transistor SW(3) is coupled to a first terminal of the unidirectional diode PD(1). A second terminal of the unidirectional diode PD(1) is coupled to the light-emitting module 603. A first terminal of the unidirectional diode PD(2) is configured to receive the external power EP. A second terminal of the unidirectional diode PD(2) is coupled to the light-emitting module 603 and a second terminal of the unidirectional diode PD(1).

In response to the control signal CS turning on the transistor SW(3), the solar power SP(2) may be provided as the working power Vdd to the light-emitting module 603 through the transistor SW(3) and the unidirectional diode PD(1). Alternatively, in response to the control signal CS not turning on the transistor SW(3), the external power EP may be provided as the working power Vdd to the light-emitting module 603 through the unidirectional diode PD(2).

Figure 8:
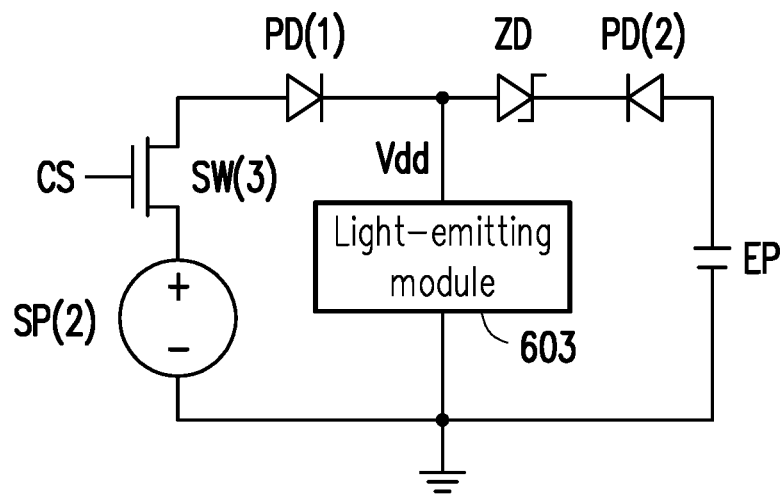
FIG. 8 is a schematic diagram of a switch circuit according to an embodiment of the invention.

FIG. 8 is a schematic diagram of a switch circuit according to an embodiment of the invention. Referring to FIG. 8, compared to the embodiment of FIG. 7, in the embodiment, the switch circuit 62 further includes a Zener diode ZD. The Zener diode ZD is connected in series between the unidirectional diodes PD(1) and PD(2). For example, an anode of the Zener diode ZD is coupled to the unidirectional diode PD(1), and a cathode of the Zener diode ZD is coupled to the unidirectional diode PD(2).

Compared to the embodiment of FIG. 7, in response to the control signal CS turning on the transistor SW(3), the solar power SP(2) is required to further overcome a voltage deference caused by the Zener diode ZD in order to be provided to the light-emitting module 603. In this way, the reliability of the switch circuit 62 is further improved.

Figure 9:
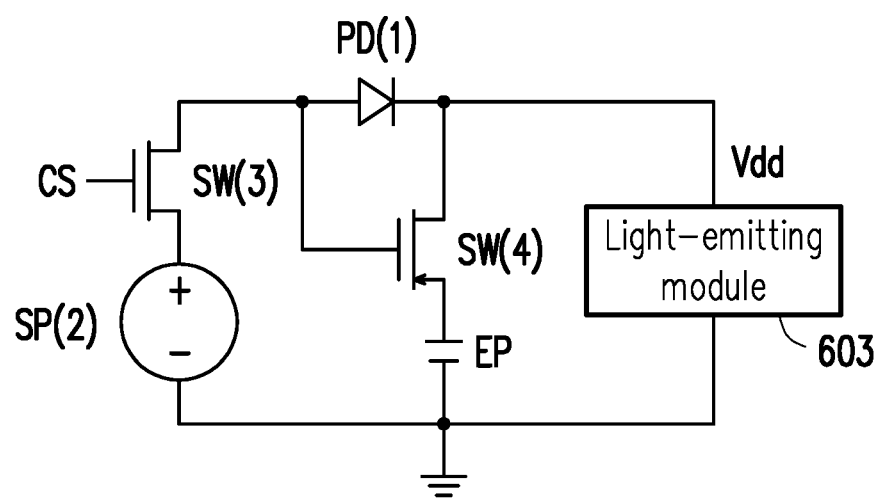
FIG. 9 is a schematic diagram of a switch circuit according to an embodiment of the invention.

FIG. 9 is a schematic diagram of a switch circuit according to an embodiment of the invention. Referring to FIG. 9, in the embodiment, the switch circuit 62 includes the transistor SW(3), a transistor SW(4) and the unidirectional diode PD(1). A first terminal (for example, a gate) of the transistor SW(4) is coupled to the third terminal of the transistor SW(3) and the first terminal of the unidirectional diode PD(1). A second terminal (for example, a source) of the transistor SW(4) is coupled to the external power EP. A third terminal (for example, a drain) of the transistor SW(4) is coupled to the second terminal of the unidirectional diode PD(1) and the light-emitting module 603.

It should be noted that in the embodiment, the transistor SW(4) is a PMOS FET. In response to the control signal CS turning on the transistor SW(3) and a voltage of the solar power SP(2) is higher than a voltage of the external power EP, the transistor SW(4) is not turned on, so that the solar power SP(2) may be provided as the working power Vdd to the light-emitting module 603 through the transistor SW(3) and the unidirectional diode PD(1). Alternatively, in response to the control signal CS not turning on the transistor SW(3) or the voltage of the solar power SP(2) is not higher than the voltage of the external power EP, the transistor SW(4) is turned on, and the external power EP may be provided as the working power Vdd to the light-emitting module 603 through the transistor SW(4).

It should be noted that in the aforementioned embodiments, the number, type and coupling relationship of each of the electronic components are merely examples, and are not intend to be limiting of the invention. In other embodiments, the coupling relationships of at least a part of the electronic components may be changed, at least a part of the electronic components may be replaced by other electronic components with the same or similar functions, and/or more electronic components may be added to the aforementioned circuit structures to provide additional functions.

Figure 10:
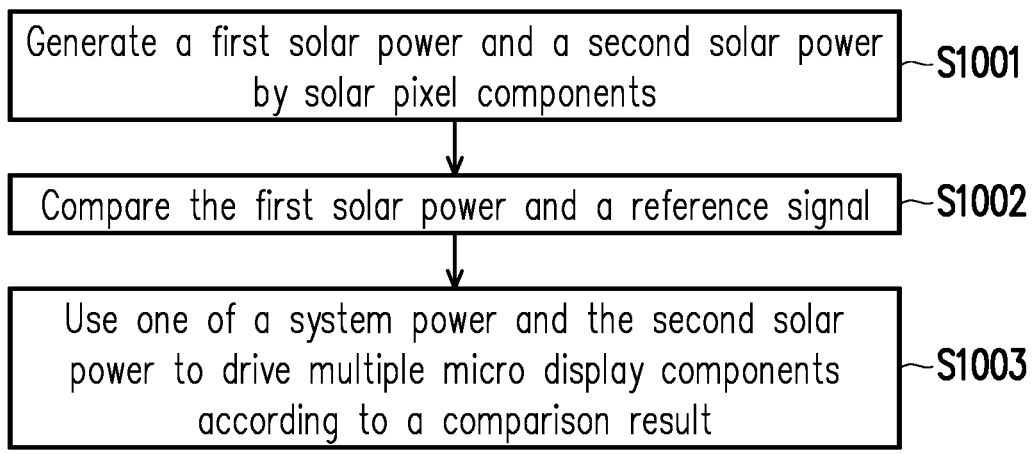
FIG. 10 is a flowchart illustrating a power switching method according to an embodiment of the invention.

FIG. 10 is a flowchart illustrating a power switching method according to an embodiment of the invention. Referring to FIG. 10, in a step S1001, a first solar power and a second solar power are generated by a plurality of solar pixel components in a solar display device. In a step S1002, the first solar power is compared with a reference signal. In a step S1003, one of a system power of the solar display device and the second solar power is used to drive a plurality of micro display components in the solar display device according to a comparison result.

However, each of the steps of FIG. 10 has been described in detail in the aforementioned description, so that details thereof are not repeated. It should be noted that each of the steps of FIG. 10 may be implemented as a plurality of program codes or circuits, which is not limited by the invention. Moreover, the method of FIG. 10 may be used in collaboration with the aforementioned embodiments, or may be used independently, which is not limited by the invention.

In summary, the solar pixel components in the solar display device are capable of generating the first solar power and the second solar power. After comparing the first solar power with the reference signal, the system power of the solar display device or the second solar power may be used for driving the micro display components in the solar display device according to the comparison result. In this way, under any sunlight condition, the display and driving capability of the solar display device may be maintained stable, thus achieving a balance between power saving and system efficiency.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A solar display device, comprising:
 a plurality of solar pixel components, configured to generate a first solar power and a second solar power;
 a plurality of micro display components, coupled to the solar pixel components; and
 a power control circuit, coupled to the solar pixel components and the micro display components,
 wherein the power control circuit is configured to compare the first solar power and a reference signal, and
 the power control circuit is further configured to use one of a system power and the second solar power to drive the micro display components according to a comparison result.

2. The solar display device as claimed in claim 1, wherein each of the micro display components is a micro light-emitting diode.

3. The solar display device as claimed in claim 1, wherein the solar pixel components comprise:
 a first solar pixel component, disposed in a non-active display region of the solar display device and configured to generate the first solar power; and
 a second solar pixel component, disposed in an active display region of the solar display device and configured to generate the second solar power.

4. The solar display device as claimed in claim 1, wherein the power control circuit comprises:
 a comparator, configured to compare the first solar power and the reference signal to generate a comparison signal;
 a switch circuit; and
 a controller, coupled to the comparator and the switch circuit,
 wherein the controller controls the switch circuit to use one of the system power and the second solar power to drive the micro display components according to the comparison signal.

5. The solar display device as claimed in claim 1, further comprising:
 a scan line;
 a data line;
 a first transistor, having a first terminal coupled to the scan line, a second terminal coupled to the data line, and a third terminal coupled to the power control circuit; and
 a second transistor, having a first terminal coupled to the power control circuit, a second terminal coupled to a working power, and a third terminal coupled to a first micro display component among the micro display components,
 wherein an operation that the power control circuit uses the one of the system power and the second solar power to drive the micro display components according to the comparison result comprises:

providing the one of the system power and the second solar power to the first terminal of the second transistor according to the comparison result, so as to drive the first micro display component through the third terminal of the second transistor.

6. The solar display device as claimed in claim 5, wherein the system power comprises a data power from the data line, and an operation that the power control circuit provides the one of the system power and the second solar power to the first terminal of the second transistor comprises:
providing the second solar power to the first terminal of the second transistor in response to a first comparison result; and
providing the data power to the first terminal of the second transistor in response to a second comparison result.

7. The solar display device as claimed in claim 5, wherein the power control circuit comprises:
a third transistor, having a first terminal configured to receive a control signal, and a second terminal configured to receive the second solar power; and
a fourth transistor, having a first terminal coupled to the third terminal of the first transistor, a second terminal coupled to a third terminal of the third transistor, and a third terminal coupled to the first terminal of the second transistor,
wherein the third transistor provides the second solar power to the first terminal of the second transistor through the fourth transistor in response to the control signal.

8. The solar display device as claimed in claim 7, wherein the power control circuit further comprises:
an update line, configured to provide an update signal;
a fifth transistor, having a first terminal coupled to the scan line, a second terminal coupled to the third terminal of the first transistor, and a third terminal coupled to the first terminal of the second transistor; and
a sixth transistor, having a first terminal coupled to the update line, a second terminal coupled to the third terminal of the fourth transistor, and a third terminal coupled to the third terminal of the fifth transistor and the first terminal of the second transistor.

9. The solar display device as claimed in claim 7, wherein the power control circuit further comprises:
an update line, configured to provide an update signal;
a fifth transistor, having a first terminal coupled to the update line, a second terminal coupled to the third terminal of the first transistor, and a third terminal coupled to the third terminal of the fourth transistor; and
a sixth transistor, having a first terminal coupled to the update line, a second terminal coupled to the third terminal of the fifth transistor and the third terminal of the fourth transistor, and a third terminal coupled to the first terminal of the second transistor.

10. The solar display device as claimed in claim 7, wherein the power control circuit further comprises:
a fifth transistor, having a first terminal coupled to the scan line, a second terminal coupled to the third terminal of the fourth transistor, and a third terminal coupled to the first terminal of the second transistor; and
a capacitor, having a first terminal coupled to the third terminal of the first transistor, and a second terminal coupled to the third terminal of the fifth transistor and the first terminal of the second transistor.

11. The solar display device as claimed in claim 1, further comprising:

a scan line;
a data line;
a first transistor, having a first terminal coupled to the scan line, and a second terminal coupled to the data line; and
a second transistor, having a first terminal coupled to a third terminal of the first transistor, a second terminal coupled to a working power, and a third terminal coupled to a first micro display component among the micro display components,
wherein an operation that the power control circuit uses the one of the system power and the second solar power to drive the micro display components according to the comparison result comprises:
providing the one of the system power and the second solar power as the working power to the second terminal of the second transistor according to the comparison result, so as to drive the first micro display component through the third terminal of the second transistor.

12. The solar display device as claimed in claim 11, wherein the system power comprises an external power provided by an external power supplier, and an operation that the power control circuit provides the one of the system power and the second solar power as the working power to the second terminal of the second transistor comprises:
providing the second solar power as the working power to the second terminal of the second transistor in response to a first comparison result; and
providing the external power as the working power to the second terminal of the second transistor in response to a second comparison result.

13. The solar display device as claimed in claim 11, wherein the power control circuit comprises:
a third transistor, having a first terminal configured to receive a control signal, and a second terminal configured to receive the second solar power; and
a first unidirectional diode, having a first terminal coupled to the third terminal of the third transistor, and a second terminal coupled to the second terminal of the second transistor,
wherein the third transistor provides the second solar power to the second terminal of the second transistor through the first unidirectional diode in response to the control signal.

14. The solar display device as claimed in claim 13, wherein the power control circuit further comprises:
a second unidirectional diode, having a first terminal configured to receive the external power, and a second terminal coupled to the second terminal of the first unidirectional diode and the second terminal of the second transistor.

15. The solar display device as claimed in claim 14, wherein the power control circuit further comprises:
a Zener diode, connected in series between the first unidirectional diode and the second unidirectional diode.

16. The solar display device as claimed in claim 13, wherein the power control circuit further comprises:
a fourth transistor, having a first terminal coupled to the third terminal of the third transistor, a second terminal configured to receive the external power, and a third terminal coupled to the second terminal of the first unidirectional diode and the second terminal of the second transistor.

17. A power switching method, adapted to a solar display device, wherein the solar display device comprises a plurality of solar pixel components and a plurality of micro display components, the power switching method comprises:
- generating a first solar power and a second solar power by the solar pixel components;
- comparing the first solar power and a reference signal; and
- using one of a system power and the second solar power to drive the micro display components according to a comparison result.

* * * * *